(12) United States Patent
Huang et al.

(10) Patent No.: US 12,360,667 B2
(45) Date of Patent: Jul. 15, 2025

(54) SEMICONDUCTOR DEVICE

(71) Applicant: TAIWAN SEMICONDUCTOR MANUFACTURING COMPANY, LTD., Hsinchu (TW)

(72) Inventors: Sheng-Po Huang, New Taipei (TW); Yen-Hsiang Huang, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 218 days.

(21) Appl. No.: 18/338,153

(22) Filed: Jun. 20, 2023

(65) Prior Publication Data

US 2024/0427489 A1 Dec. 26, 2024

(51) Int. Cl.
*G11C 11/00* (2006.01)
*G06F 3/06* (2006.01)
*G11C 7/10* (2006.01)

(52) U.S. Cl.
CPC .......... *G06F 3/0604* (2013.01); *G06F 3/0655* (2013.01); *G06F 3/0673* (2013.01); *G11C 7/1006* (2013.01)

(58) Field of Classification Search
CPC .... G06F 3/0604; G06F 3/0655; G06F 3/0673; G11C 7/1006
USPC ......................................................... 365/148
See application file for complete search history.

(56) References Cited

U.S. PATENT DOCUMENTS

| | | | | |
|---|---|---|---|---|
| 7,483,292 B2* | 1/2009 | Lung | ................... | G11C 11/5678 365/158 |
| 8,750,032 B2* | 6/2014 | Kawahara | ........... | G11C 11/1659 365/158 |
| 10,811,069 B2* | 10/2020 | Patel | ..................... | H10B 61/22 |

OTHER PUBLICATIONS

Xue, C.-X. et al., "A 1Mb Multibit ReRAM Computing-In-Memory Macro with 14.6ns Parallel MAC Computing Time for CNN-Based AI Edge Processors", 2019 IEEE International Solid-State Circuits Conference, ISSCC 2019, pp. 388-390.

* cited by examiner

*Primary Examiner* — Tha-O H Bui
(74) *Attorney, Agent, or Firm* — Maschoff Brennan (57) ABSTRACT

A semiconductor device includes a memory array. The memory array is configured to calculate first data and second data, and includes a first memory cell and a second memory cell. The first memory cell is configured to generate a first current signal at a first node, in response to the first data. The second memory cell is configured to generate a second current signal at the first node when the first memory cell generating the first current signal, in response to the second data. When the first data has a first data value and the second data has a second data value, the second memory cell is further configured cancel the first current signal with the second current signal. The second data value is a negative value of the first data value.

20 Claims, 9 Drawing Sheets

SEMICONDUCTOR DEVICE

BACKGROUND

Computing-in-memory (CIM) is the technique of running computer calculations entirely in computer memory (for example, in random access memory). The CIM typically implies large-scale, complex calculations which require specialized systems software to run the calculations on computers working together in a cluster. The calculations are performed to binary input data and binary weights stored in the memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

Figure 1:
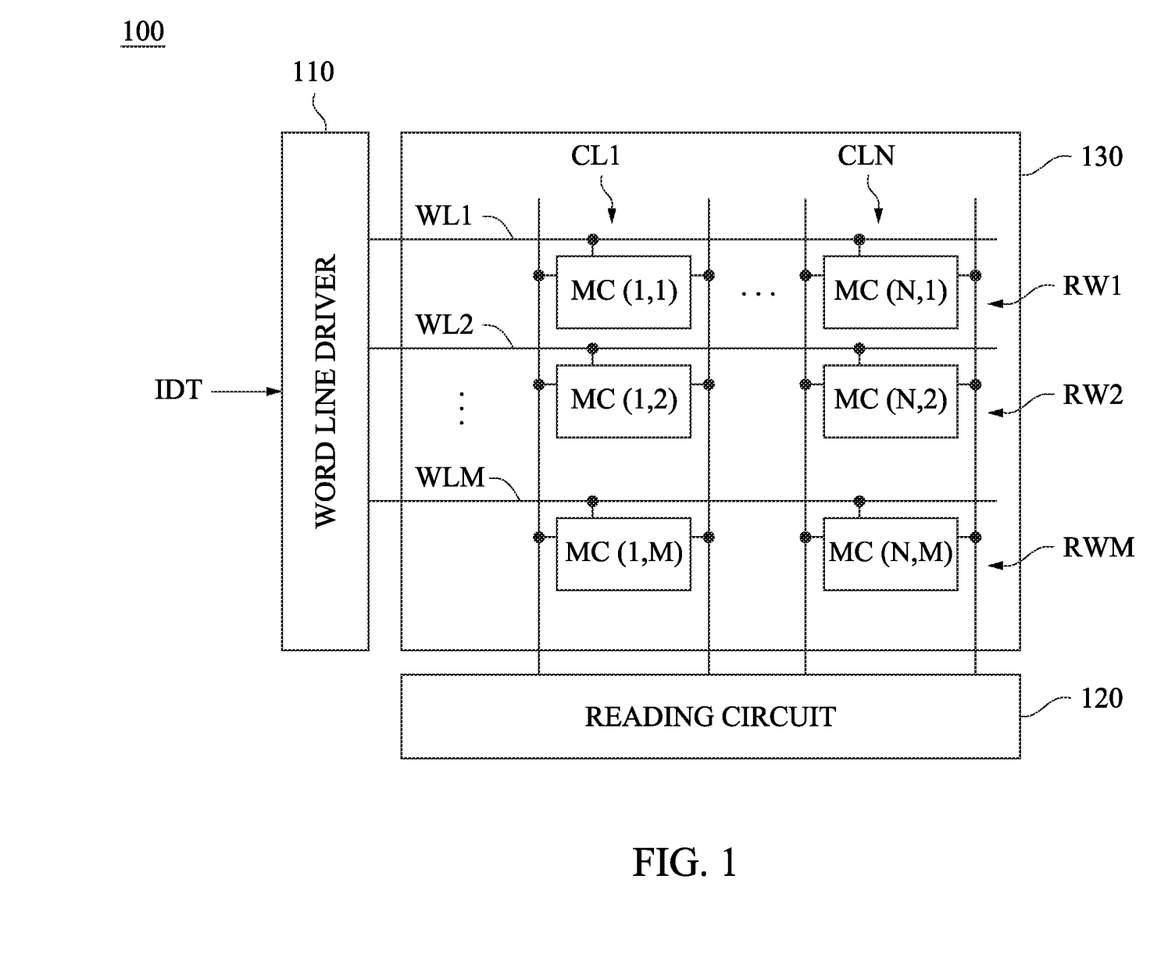
FIG. 1 is a schematic diagram of a semiconductor device, in accordance with some embodiments of the present disclosure.

FIG. 1 is a schematic diagram of a semiconductor device 100, in accordance with some embodiments of the present disclosure. In some embodiments, the semiconductor device 100 is a memory device configured to perform computing-in-memory (CIM) to input data IDT. As illustratively shown in FIG. 1, the semiconductor device 100 includes a word line driver 110, a reading circuit 120 and a memory array 130. In some embodiments, the memory array 130 is implemented by a resistive random-access memory (ReRAM) array or a magnetoresistive random-access memory (MRAM) array.

In some embodiments, the word line driver 110 is configured to generate word line signals WL1-WLM according to the input data IDT. For example, the word line driver 110 transforms the input data IDT into the word line signals WL1-WLM. The reading circuit 120 is configured to generate voltage signals SL1-SLN and receive the current signals IS1-ISN. It is noted that N and M are positive integers. The memory array 130 is configured to store multiple weight values, and perform computations to the weight values and the input data IDT to generate the current signals IS1-ISN.

As illustratively shown in FIG. 1, the memory array 130 includes memory cells MC(1, 1)-MC(N, M). Each of the memory cells MC(1, 1)-MC(N, M) is configured to store a corresponding one of the weight values. The memory cells MC(1, 1)-MC(N, M) are arranged in columns CL1-CLN and rows RW1-RWM. For example, the memory cells MC(1, 1)-MC(1, M) are included in the column CL1. The memory cells MC(N, 1)-MC(N, M) are included in the column CLN. The memory cells MC(1, 1)-MC(N, 1) are included in the row RW1. The memory cells MC(1, M)-MC(N, M) are included in the row RWM.

In some embodiments, the rows RW1-RWM are configured to receive the word line signals WL1-WLM, respectively. The columns CL1-CLN are configured to receive the voltage signals SL1-SLN, respectively. Each of the columns CL1-CLN is configured to generate a corresponding one of the current signals IS1-ISN according to the word line signals WL1-WLM and the weight values stored in the corresponding column.

For example, the column CL1 generates the current signal IS1 according to the word line signals WL1-WLM and the weight values stored in the memory cells MC(1, 1)-MC(1, M). The column CLN generates the current signal ISN according to the word line signals WL1-WLM and the weight values stored in the memory cells MC(N, 1)-MC(N, M).

In some embodiments, the reading circuit 120 includes a column multiplexer (not shown in figures) configured to select one or more of the columns CL1-CLN. The reading circuit 120 is configured to output corresponding one or more of the current signals IS1-ISN from the selected one or more of the columns CL1-CLN. In some embodiments, the reading circuit 120 is referred to as an input/output circuit.

Figure 2:
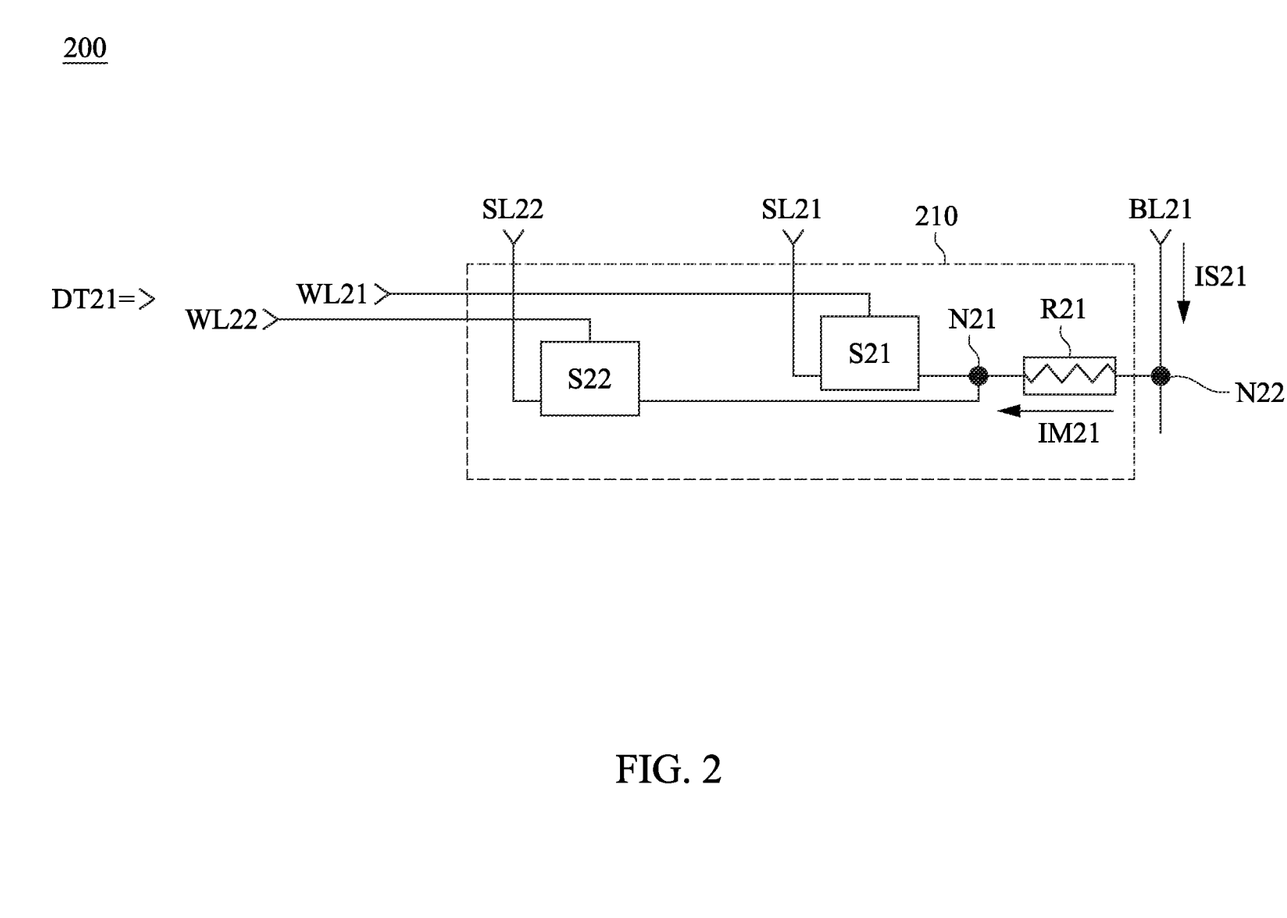
FIG. 2 is a circuit diagram of a memory array corresponding to the memory array shown in FIG. 1, in accordance with some embodiments of the present disclosure.

FIG. 2 is a circuit diagram of a memory array 200 corresponding to the memory array 130 shown in FIG. 1, in accordance with some embodiments of the present disclosure. As illustratively shown in FIG. 2, the memory array 200 includes a memory cell 210. In some embodiments, the memory cell 210 is configured to generate a current signal IM21 at a node N22 according to word line signals WL21 and WL22. The memory array 200 is configured to combine the current signal IM21 with one or more current signal from other memory cells (for example, the memory cells 801-805 shown in FIG. 8) to generate a current signal IS21 at the node N22.

As illustratively shown in FIG. 2, the memory cell 210 includes a resistive element R21 and switches S21, S22. A terminal of the resistive element R21 is configured to receive a voltage signal BL21 at the node N22, and another terminal of the resistive element R21 is coupled to a node N21. A terminal of the switch S21 is coupled to the node N21, another terminal of the switch S21 is configured to receive a voltage signal SL21, and a control terminal of the switch S21 is configured to receive the word line signal WL21. A terminal of the switch S22 is coupled to the node N21, another terminal of the switch S22 is configured to receive a voltage signal SL22, and a control terminal of the switch S22 is configured to receive the word line signal WL22.

In some embodiments, the memory cell 210 is configured to perform a calculation to input data DT21 and a weight value of the resistive element R21 to generate the current signal IM21. A current value of the current signal IM21 indicates a product of a data value of the input data DT21 and the weight value of the resistive element R21.

In some embodiments, the weight value of the resistive element R21 is associated with a resistance RV21 of the resistive element R21. For example, when the resistance RV21 is approximately equal to a first resistance RL1, the resistive element R21 has a weight value of 1. When the resistance RV21 is approximately equal to a second resistance RL2, the resistive element R21 has a weight value of 0. In some embodiments, the first resistance RL1 is lower than the second resistance RL2.

In some embodiments, the data value of the input data DT21 is associated with the word line signals WL21 and WL22. For example, the word line driver 110 shown in FIG. 1 transforms the input data DT21 into the word line signals WL21 and WL22. The word line signals WL21 and WL22 have different voltage levels for different data values of the input data DT21. Accordingly, the switches S21 and S22 are controlled according to the data value of the input data DT21.

For example, when the input data DT21 has a first data value (for example, +1), the word line signal WL21 has an enable voltage level for the switch S21 to turn on the switch S21, and the word line signal WL22 has a disable voltage level for the switch S22 to turn off the switch S22. When the input data DT21 has a second data value (for example, 0), the word line signal WL21 has a disable voltage level for the switch S21 to turn off the switch S21, and the word line signal WL22 has the disable voltage level for the switch S22 to turn off the switch S22. When the input data DT21 has a third data value (for example, −1), the word line signal WL21 has the disable voltage level for the switch S21 to turn off the switch S21, and the word line signal WL22 has an enable voltage level for the switch S22 to turn on the switch S22.

In some embodiments, a voltage level of the voltage signal BL21 is between a voltage level of the voltage signal SL21 and a voltage level of the voltage signal SL22, and a voltage difference between the voltage levels of the voltage signals BL21 and SL21 is approximately equal to a voltage difference between the voltage levels of the voltage signals BL21 and SL22. For example, the voltage signals BL21, SL21 and SL22 approximately have voltage levels of VR, 0 and 2×VR, respectively. It is noted that VR is a positive number.

In the embodiments described above, when the input data DT21 has the data value of +1, the node N21 has the voltage level of 0, and the current signal IM21 flows from the node N22 to the node N21 and has a current value of VR/RV21. When the input data DT21 has the data value of −1, the node N21 has the voltage level of 2×VR, and the current signal IM21 flows from the node N21 to the node N22 and has a current value of VR/RV21. When the input data DT21 has the data value of 0, the node N21 is floated and the current signal IM21 has a current value of zero.

As described above, for three different data values of the input data DT21, the current signal IM21 has three different current values of VR/RV21, −VR/RV21 and zero, in which the negative sign represents that the flowing direction of the current signal IM21 is from the node N21 to the node N22. The current value of the current signal IM21 indicates the product of the data value of the input data DT21 and the weight value of the resistive element R21.

In some embodiments, when the current signal IM21 has the current value of VR/RV21, the current signal IS21 is increased by the current value of VR/RV21. When the current signal IM21 has the current value of −VR/RV21, the current signal IS21 is decreased by the current value of VR/RV21. When the current signal IM21 has the current value of zero, the current signal IS21 is not changed by the current signal IM21.

In some embodiments, the memory array 200 is configured to combine the current signal IM21 and another current signal from another memory cell (for example, the memory cell 802 shown in FIG. 8), which is coupled to the node N22, to perform a summation corresponding to two data values of the memory cell 210 and the other memory cell. For example, in response to the memory cell 210 receiving data value +1, the current signal IM21 has the current value of VR/RV21. At the same time, in response to the other memory cell receiving data value −1, the other current signal has the current value of −VR/RV21. The current signal IM21 and the other current signal are generated simultaneously at the node N22 to generate the current signal IS21 corresponding to the summation. Accordingly, the current signal IM21 and the other current signal cancel each other at the node N22, and the current level of the current signal IS21 is not changed. The memory array 200 performs the summation corresponding to the data values +1 and −1 by the cancellation.

In some approaches, a memory cell only includes one switch operating according to input data. Data values of +1 and −1 need to be processed in different cycles. After a positive result of the data values of +1 and a negative result of the data values of −1 are generated, a final result is generated by subtracting the positive result with the negative result. As a result, the operation time is increased.

Compared to the above approaches, in some embodiments of the present disclosure, the memory cell 210 includes two switches S21 and S22 adjusting the node N21 to the different voltage levels of 0 or 2×VR in response to the data value of +1 or −1. Accordingly, the current signal IM21 has the corresponding current value of VR/RV21 or −VR/RV21. With two or more memory cells having the structure of the memory cell 210 and being coupled to the same node N22, the data values of +1 and −1 are processed simultaneously, and the summation of the data values of +1 and −1 are generated directly when the current signal is generated. The extra cycles and extra subtracting operation are not required. As a result, the operation time is decreased.

Referring to FIG. 2 and FIG. 1, the memory array 200, the memory cell 210, the current signal IS21 and the input data DT21 are embodiments of the memory array 130, the memory cell MC(1, 1), the current signal IS1 and the input data IDT, respectively. The word line signals WL21 and WL22 are embodiments of the word line signal WL1. The voltage signals SL21 and SL22 are embodiments of the voltage signal SL1. Therefore, some descriptions are not repeated for brevity.

Figure 3:
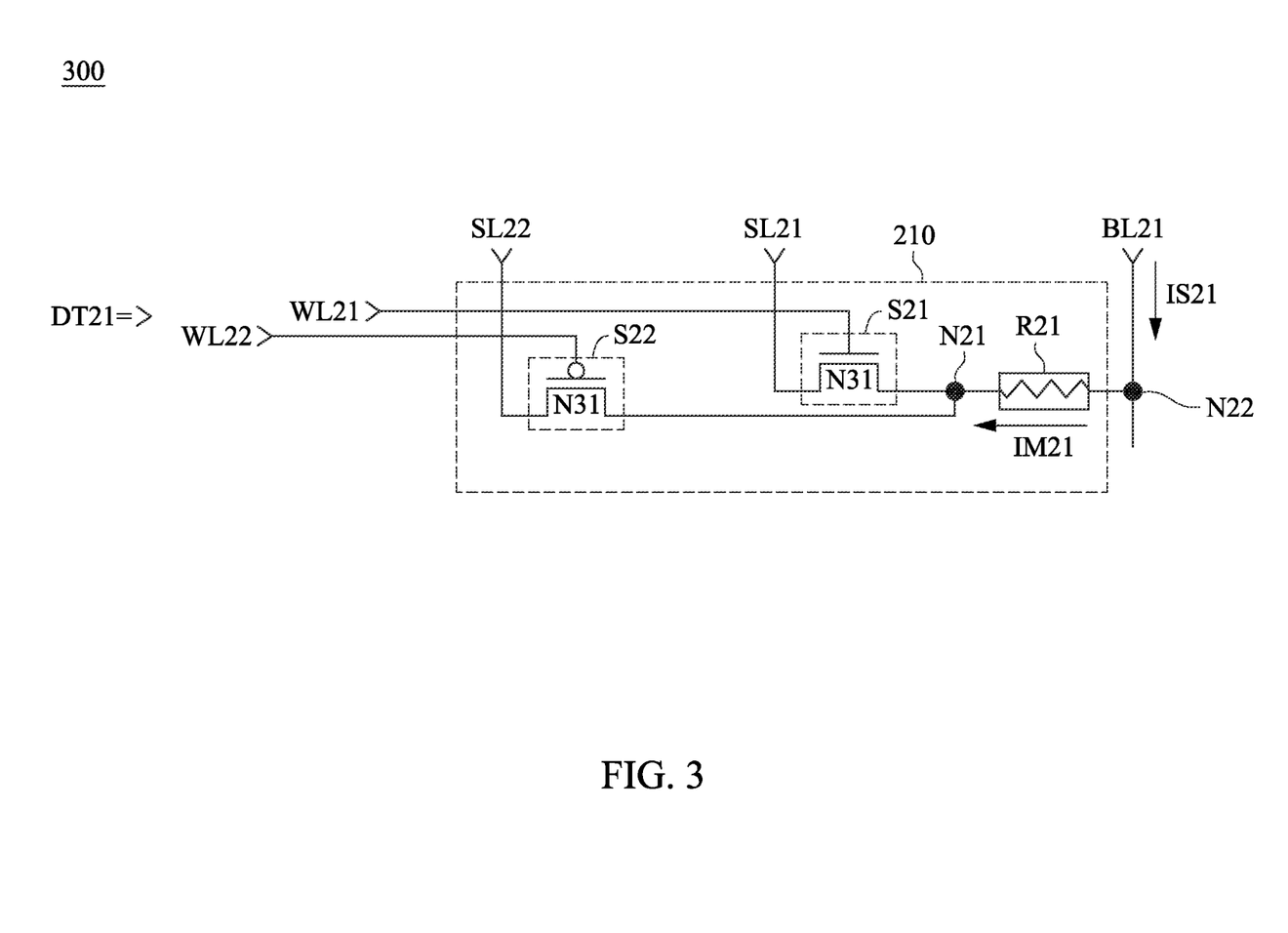
FIG. 3 is a circuit diagram of a memory array corresponding to the memory array shown in FIG. 2, in accordance with some embodiments of the present disclosure.

FIG. 3 is a circuit diagram of a memory array 300 corresponding to the memory array 200 shown in FIG. 2, in accordance with some embodiments of the present disclosure. Referring to FIG. 2 and FIG. 3, the memory array 300 is an embodiment of the memory array 200. FIG. 3 follows a similar labeling convention to that of FIG. 2. For brevity, the discussion will focus more on differences between FIG. 2 and FIG. 3 than on similarities.

As illustratively shown in FIG. 3, the switches S21 and S22 are implemented by an N-type metal-oxide-semiconductor (NMOS) transistor N31 and a P-type metal-oxide-semiconductor (PMOS) transistor P31, respectively. In some embodiments, memory cell 210 is implemented by a complementary field-effect transistor (CFET). The transistor N31 is formed in an N-type portion of the CFET, and the transistor P31 is formed in a P-type portion of the CFET.

Figure 4:
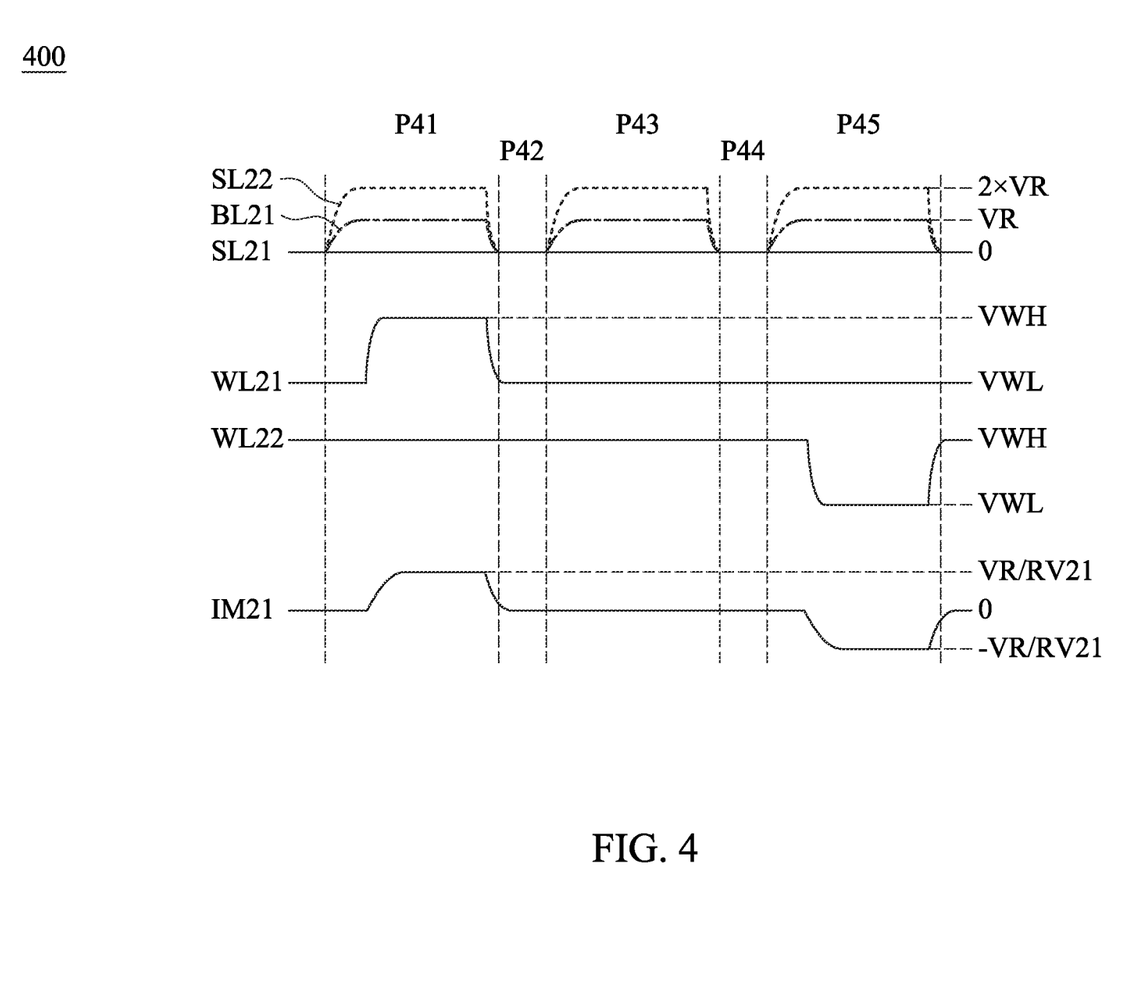
FIG. 4 is a timing diagram of the signals associated with the memory array shown in FIG. 3, in accordance with some embodiments of the present disclosure.

FIG. 4 is a timing diagram 400 of the signals associated with the memory array 300 shown in FIG. 3, in accordance with some embodiments of the present disclosure. As illustratively shown in FIG. 4, the timing diagram 400 includes periods P41-P45 arranged continuously in order.

Before the period P41, each of the voltage signals BL21, SL21, SL22 has a voltage level of zero voltage. The word line signal WL21 has a voltage level VWL, which is a disable voltage level of the transistor N31, to turn off the transistor N31. The word line signal WL22 has a voltage level VWH, which is a disable voltage level of the transistor P31, to turn off the transistor P31. In response to each of the transistors N31 and P31 being turned off, the node N21 is floated and the current signal IM21 has a current level of zero ampere. In some embodiments, the voltage level VWL is lower than the voltage level VWH.

During the period P41, the voltage signal BL21 has the voltage level of VR. The voltage signal SL21 has the voltage level of zero voltage. The voltage signal SL22 has the voltage level of 2×VR. The input data DT21 has the data value of +1. Accordingly, the word line signal WL21 has the voltage level VWH, which is an enable voltage level of the transistor N31, to turn on the transistor N31. The word line signal WL22 has the voltage level VWH to turn off the transistor P31.

In response to the transistor N31 being turned on to provide the voltage signal SL21 to the node N21, the current signal IM21 has the current level of VR/RV21. The current level of VR/RV21 corresponds to a product of the input data DT21 having the data value of +1 and the weight value of the resistive element R21. Accordingly, the memory cell 210 outputs the product by the current signal IM21.

During the period P42, each of the voltage signals BL21, SL21, SL22 has the voltage level of zero voltage. The word line signal WL21 has the voltage level VWL to turn off the transistor N31. The word line signal WL22 has the voltage level VWH to turn off the transistor P31. In response to each of the transistors N31 and P31 being turned off, the node N21 is floated and the current signal IM21 has the current level of zero ampere.

During the period P43, the voltage signal BL21 has the voltage level VR. The voltage signal SL21 has the voltage level of zero voltage. The voltage signal SL22 has the voltage level 2×VR. The input data DT21 has the data value of 0. Accordingly, the word line signal WL21 has the voltage level VWL to turn off the transistor N31. The word line signal WL22 has the voltage level VWH to turn off the transistor P31.

In response to each of the transistors N31 and P31 being turned off, the node N21 is floated and the current signal IM21 has the current level of zero ampere. The current level of zero ampere corresponds to a product of the input data DT21 having the data value of 0 and the weight value of the resistive element R21. Accordingly, the memory cell 210 outputs the product by the current signal IM21.

During the period P44, each of the voltage signals BL21, SL21, SL22 has the voltage level of zero voltage. The word line signal WL21 has the voltage level VWL to turn off the transistor N31. The word line signal WL22 has the voltage level VWH to turn off the transistor P31. In response to each of the transistors N31 and P31 being turned off, the node N21 is floated and the current signal IM21 has the current level of zero ampere.

During the period P45, the voltage signal BL21 has the voltage level VR. The voltage signal SL21 has the voltage level of zero voltage. The voltage signal SL22 has the voltage level 2×VR. The input data DT21 has the data value of −1. Accordingly, the word line signal WL21 has the voltage level VWL to turn off the transistor N31. The word line signal WL22 has the voltage level VWL to turn on the transistor P31.

In response to the transistor P31 being turned on to provide the voltage signal SL22 to the node N21, the current signal IM21 has the current level of −VR/RV21. The current level of −VR/RV21 corresponds to a product of the input data DT21 having the data value of −1 and the weight value of the resistive element R21. Accordingly, the memory cell 210 outputs the product by the current signal IM21.

As described above, the memory cell 210 outputs the products during the periods P41, P43 and P45, and does not output the products during the periods P42 and P44. In some embodiments, when the memory cell 210 does not output the products, such as during the periods P42 and P44, each of the voltage signals BL21, SL21, SL22 are adjusted to the voltage level of zero, to save electrical power.

Figure 5:
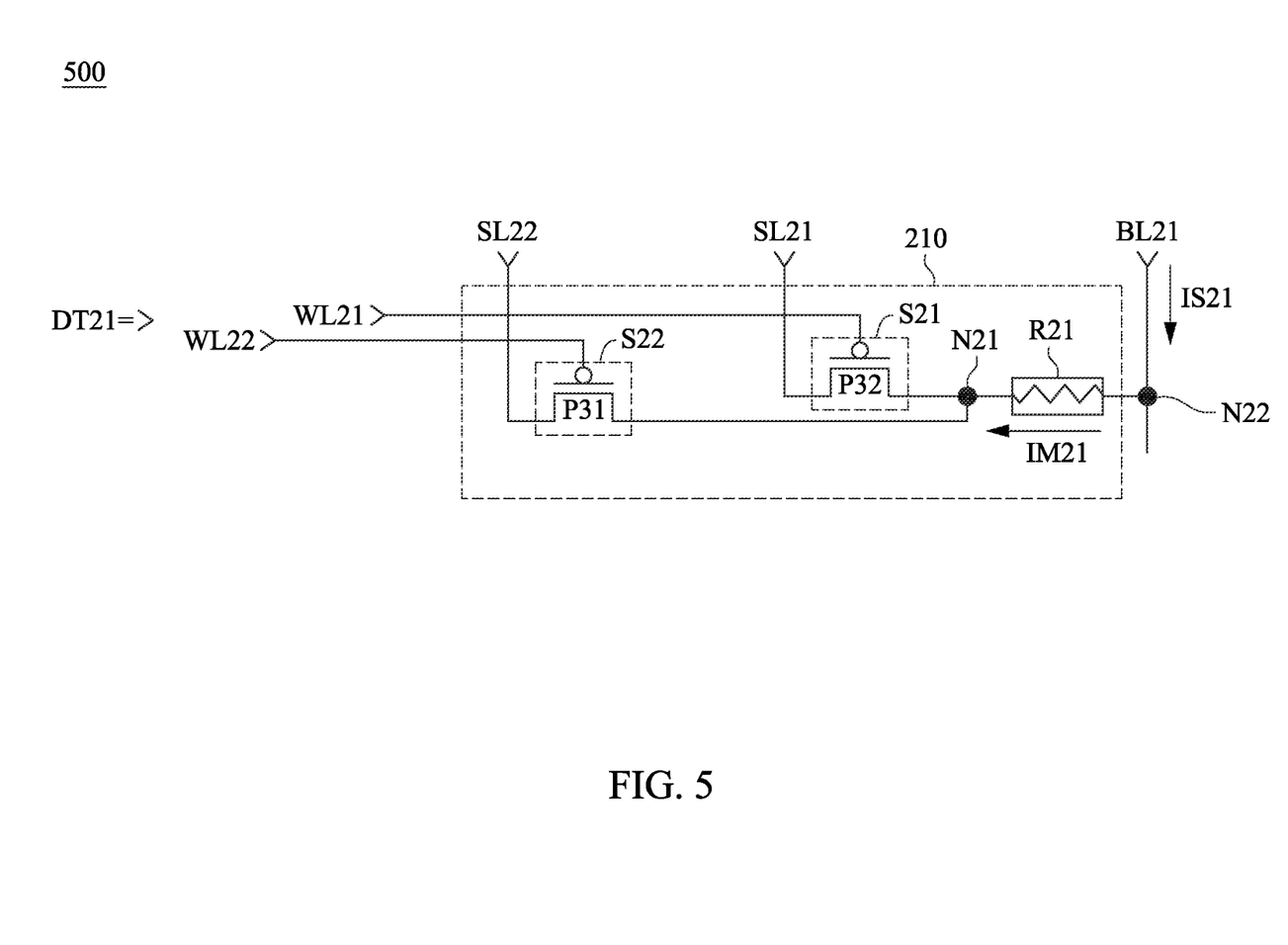
FIG. 5 is a circuit diagram of a memory array corresponding to the memory array shown in FIG. 2, in accordance with some embodiments of the present disclosure.

FIG. 5 is a circuit diagram of a memory array 500 corresponding to the memory array 200 shown in FIG. 2, in accordance with some embodiments of the present disclosure. Referring to FIG. 2 and FIG. 5, the memory array 500 is an embodiment of the memory array 200. FIG. 5 follows a similar labeling convention to that of FIG. 3. For brevity, the discussion will focus more on differences between FIG. 5 and FIG. 3 than on similarities.

Referring to FIG. 5 and FIG. 3, in the embodiments shown in FIG. 5, the switches S21 is implemented by a PMOS transistor P32 instead of the NMOS transistor N31. Accordingly, when the word line signal WL21 has the voltage level VWL, the transistor P32 is turned on, and when the word line signal WL21 has the voltage level VWH, the transistor P32 is turned off.

Referring to FIG. 5 and FIG. 4, in some embodiments, the memory cell 210 shown in FIG. 5 performs operations similar with the operations shown in FIG. 4. In such embodiments, during the period P41, in response to the input data DT21 having the data value of +1, the word line signal WL21 has the voltage level VWL to turn on the transistor P32. During the period P43, in response to the input data DT21 having the data value of 0, the word line signal WL21 has the voltage level VWH to turn off the transistor P32. During the period P45, in response to the input data DT21 having the data value of −1, the word line signal WL21 has the voltage level VWH to turn off the transistor P32.

Figure 6:
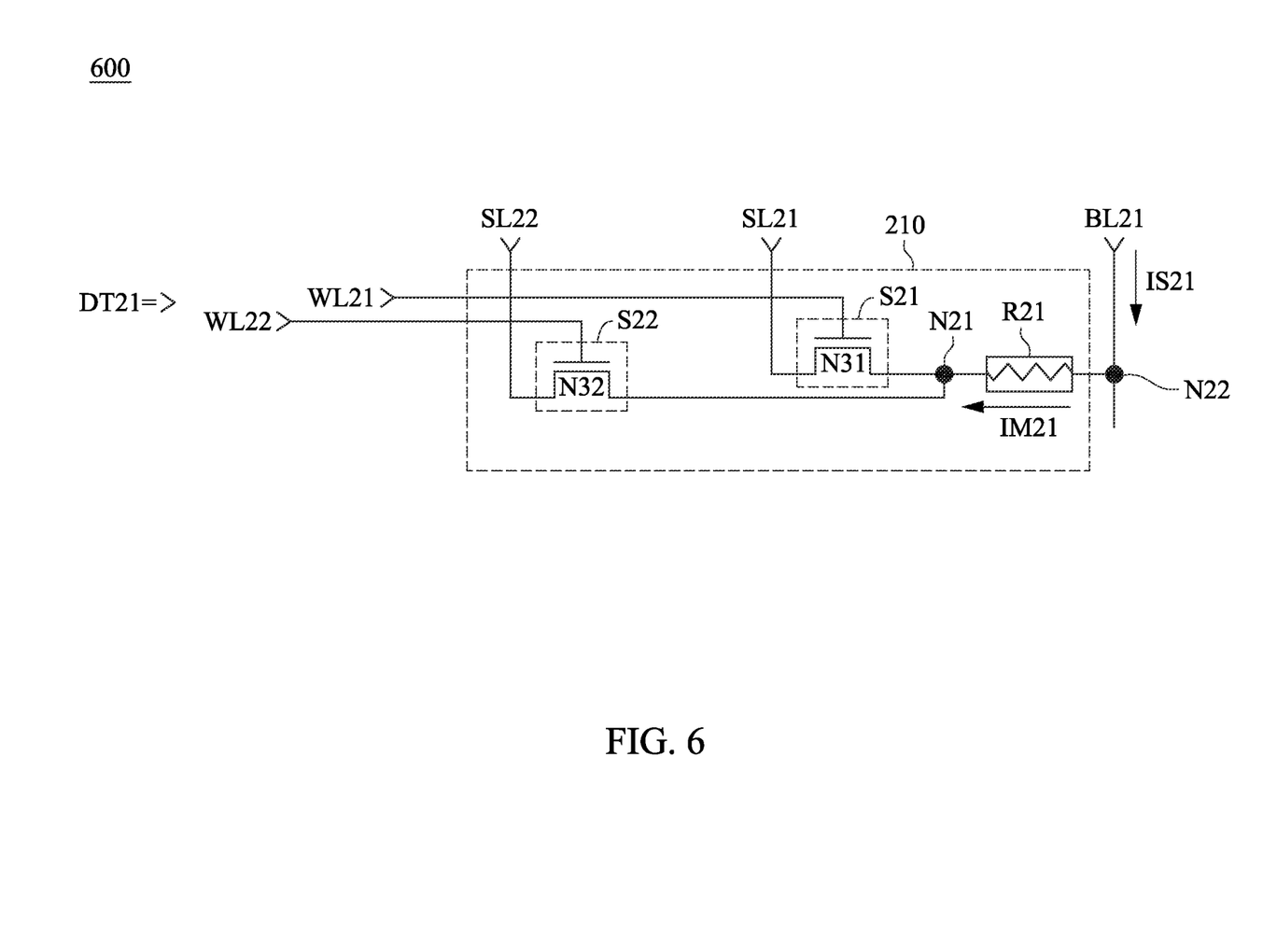
FIG. 6 is a circuit diagram of a memory array corresponding to the memory array shown in FIG. 2, in accordance with some embodiments of the present disclosure.

FIG. 6 is a circuit diagram of a memory array 600 corresponding to the memory array 200 shown in FIG. 2, in accordance with some embodiments of the present disclosure. Referring to FIG. 2 and FIG. 6, the memory array 600 is an embodiment of the memory array 200. FIG. 6 follows a similar labeling convention to that of FIG. 3. For brevity, the discussion will focus more on differences between FIG. 6 and FIG. 3 than on similarities.

Referring to FIG. 6 and FIG. 3, in the embodiments shown in FIG. 6, the switches S22 is implemented by an NMOS transistor N32 instead of the PMOS transistor P31. Accordingly, when the word line signal WL22 has the voltage level VWH, the transistor P32 is turned on, and when the word line signal WL21 has the voltage level VWL, the transistor P32 is turned off.

Referring to FIG. 6 and FIG. 4, in some embodiments, the memory cell 210 shown in FIG. 6 performs operations similar with the operations shown in FIG. 4. In such embodiments, during the period P41, in response to the input data DT21 having the data value of +1, the word line signal WL22 has the voltage level VWL to turn off the transistor N32. During the period P43, in response to the input data DT21 having the data value of 0, the word line signal WL22 has the voltage level VWL to turn off the transistor N32. During the period P45, in response to the input data DT21 having the data value of −1, the word line signal WL22 has the voltage level VWH to turn on the transistor N32.

Figure 7:
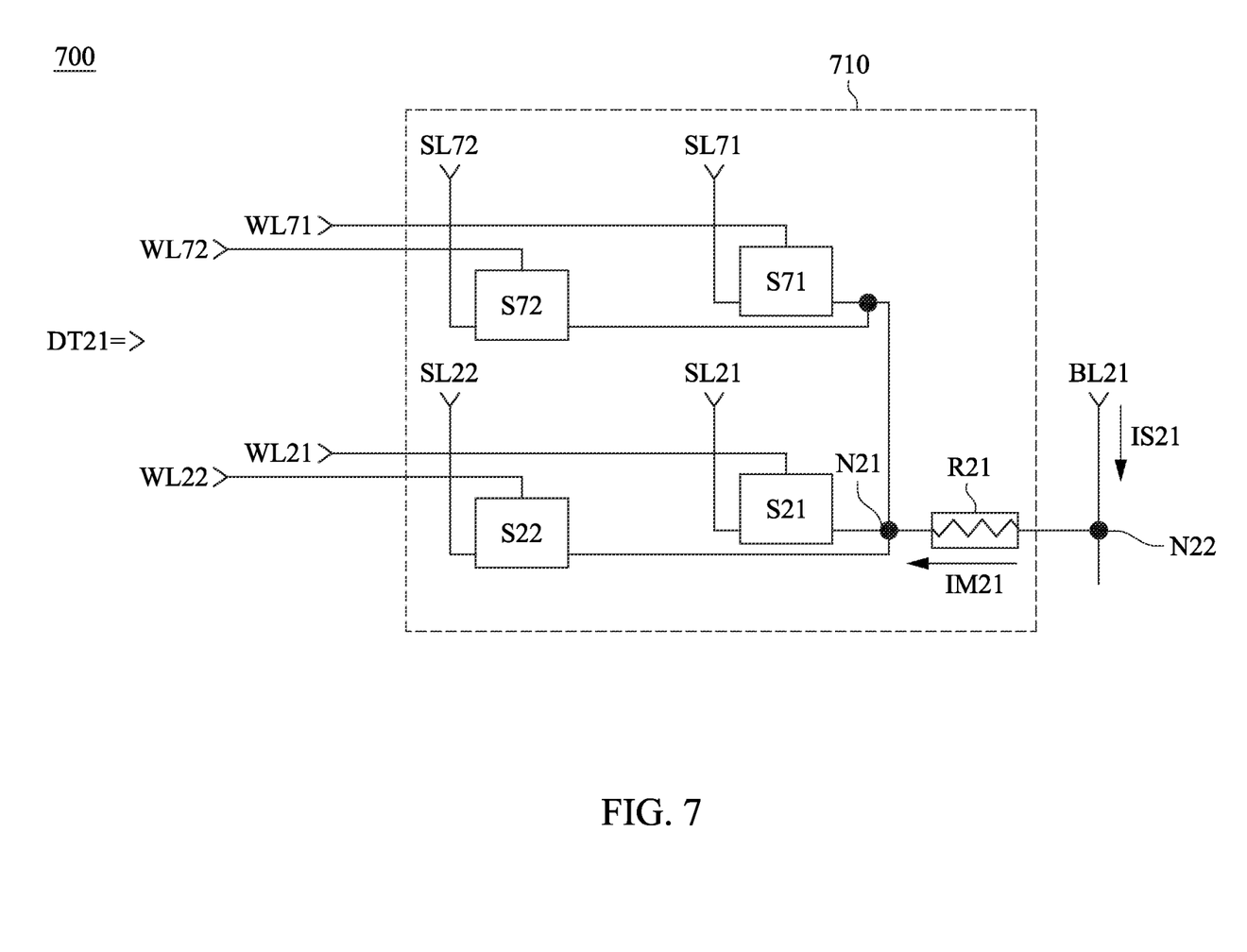
FIG. 7 is a circuit diagram of a memory array corresponding to the memory array shown in FIG. 2, in accordance with some embodiments of the present disclosure.

FIG. 7 is a circuit diagram of a memory array 700 corresponding to the memory array 200 shown in FIG. 2, in accordance with some embodiments of the present disclosure. As illustratively shown in FIG. 7, the memory array 700 includes a memory cell 710. Referring to FIG. 7 and FIG. 2, the memory array 700 and the memory cell 710 are alternative embodiments of the memory array 200 and the memory cell 210, respectively. FIG. 7 follows a similar labeling convention to that of FIG. 2. For brevity, the discussion will focus more on differences between FIG. 2 and FIG. 7 than on similarities.

Referring to FIG. 7 and FIG. 2, compared to the memory cell 210, the memory cell 710 further includes switches S71 and S72. A terminal of the switch S71 is coupled to the node N21, another terminal of the switch S71 is configured to receive a voltage signal SL71, and a control terminal of the switch S71 is configured to receive a word line signal WL71. A terminal of the switch S72 is coupled to the node N21, another terminal of the switch S72 is configured to receive a voltage signal SL72, and a control terminal of the switch S72 is configured to receive a word line signal WL72.

In some embodiments, the data value of the input data DT21 is associated with the word line signals WL21, WL22, WL71 and WL72. The word line driver 110 shown in FIG. 1 is further configured to transform the input data DT21 into the word line signals WL21, WL22, WL71 and WL72. The word line signals WL21, WL22, WL71 and WL72 has different voltage levels for different data values of the input data DT21. Accordingly, the switches S21, S22, S71 and S72 are controlled according to the data value of the input data DT21.

For example, when the input data DT21 has a fourth data value (for example, +2), the word line signal WL71 has an enable voltage level for the switch S71 to turn on the switch S71, and each of the word line signals WL21, WL22 and WL72 has a corresponding disable voltage level for the switches S21, S22 and S72 to turn off the switches S21, S22 and S72. When the input data DT21 has a fifth data value (for example, −2), the word line signal WL72 has an enable voltage level for the switch S72 to turn on the switch S72, and each of the word line signals WL21, WL22 and WL71 has a corresponding disable voltage level for the switches S21, S22 and S71 to turn off the switches S21, S22 and S71.

In some embodiments, the voltage levels of the voltage signal SL71, SL21, the voltage signals BL21, SL22, SL72 are arranged in order. For example, the voltage signal SL71, SL21, the voltage signals BL21, SL22, SL72 approximately have voltage levels of −VR, 0. VR, 2×VR and 3×VR, respectively.

In the embodiments described above, when the input data DT21 has the data value of +2, the node N21 has the voltage level of −VR, and the current signal IM21 flows from the node N22 to the node N21 and has a current value of 2×VR/RV21. When the input data DT21 has the data value of −2, the node N21 has the voltage level of 3×VR, and the current signal IM21 flows from the node N21 to the node N22 and has a current value of 2×VR/RV21. The cases with the input data DT21 having the data values of −1, 0 and +1 are described above with the embodiments associated with FIG. 2. Therefore, some descriptions are not repeated for brevity.

As described above, in response to the five different data values of the input data DT21, the current signal IM21 has the five different current values of 2×VR/RV21, VR/RV21, 0, −VR/RV21, and −2×VR/RV21, in which the negative sign represents that the flowing direction of the current signal IM21 is from the node N21 to the node N22. The current value of the current signal IM21 indicates the product of the data value of the input data DT21 and the weight value of the resistive element R21.

Referring to FIG. 2 to FIG. 7, a configuration of the switches S71 and S72 are similar with the switches S21 and S22. In various embodiments, each of the switches S71 and S72 is implemented by a PMOS transistor or an NMOS transistor. When one of the switches S71 and S72 is implemented by a PMOS transistor, a corresponding one of the word line signals WL71 and WL72 has the voltage level VWL to turn on the one of the switches S71 and S72, and has the voltage level VWH to turn off the one of the switches S71 and S72. When one of the switches S71 and S72 is implemented by an NMOS transistor, a corresponding one of the word line signals WL71 and WL72 has the voltage level VWH to turn on the one of the switches S71 and S72, and has the voltage level VWL to turn off the one of the switches S71 and S72.

In various embodiments, the memory cell 710 further includes more switches (not shown in figures) coupled to the node N21 and configured to adjust the node N21 to corresponding voltage levels according to various data values of the input data DT21. Accordingly, the memory cell 710 outputs the current signal IM21 corresponding the various data values of the input data DT21.

Figure 8:
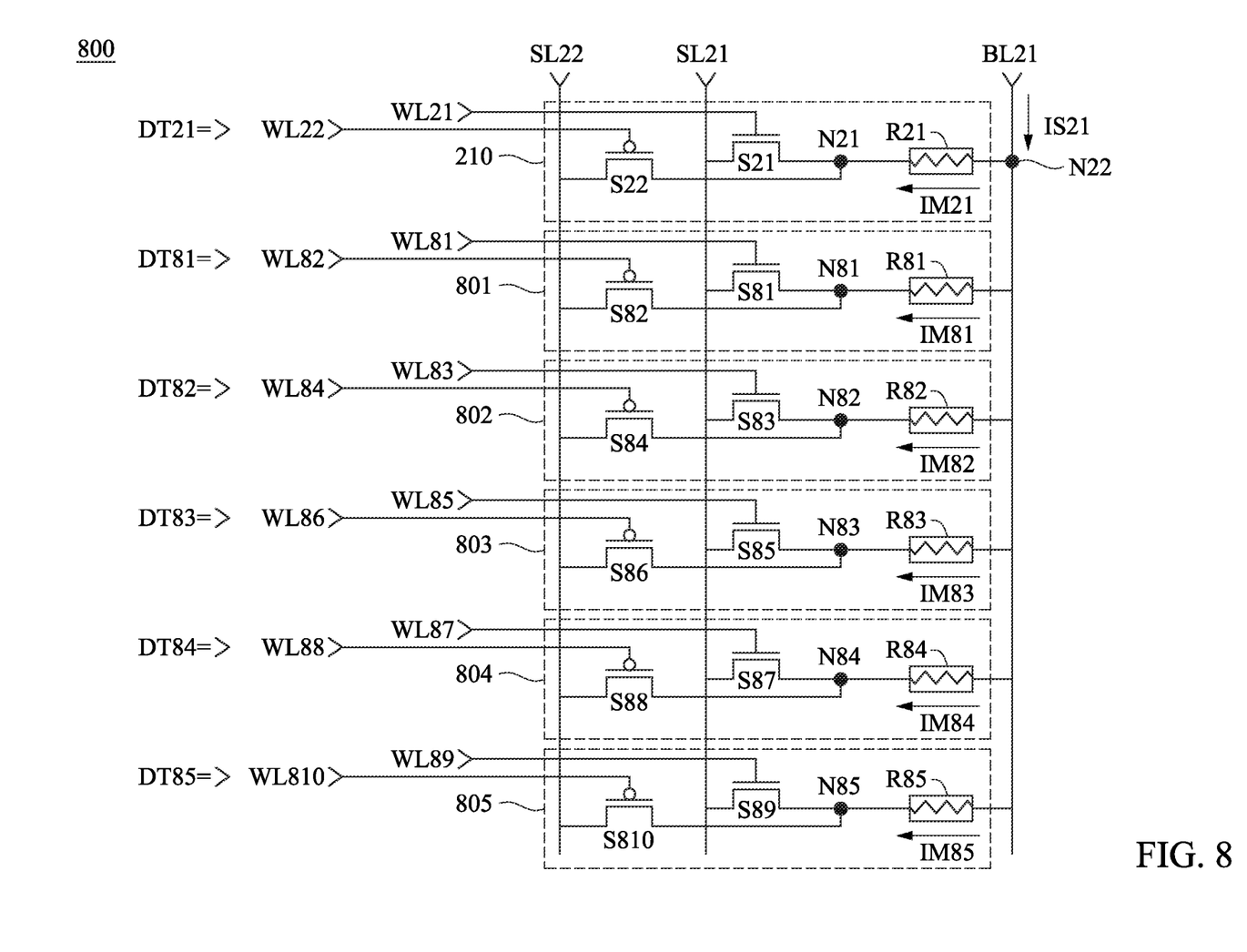
FIG. 8 is a circuit diagram of a memory array corresponding to the memory array shown in FIG. 2, in accordance with some embodiments of the present disclosure.

FIG. 8 is a circuit diagram of a memory array 800 corresponding to the memory array 200 shown in FIG. 2, in accordance with some embodiments of the present disclosure. Referring to FIG. 8 and FIG. 2, the memory array 800 is an alternative embodiment of the memory array 200. FIG. 8 follows a similar labeling convention to that of FIG. 2. For brevity, the discussion will focus more on differences between FIG. 2 and FIG. 8 than on similarities.

Referring to FIG. 8 and FIG. 2, compared to the memory array 200, the memory array 800 further includes memory cells 801-805. The memory cell 801 is configured to generate a current signal IM81 according to input data DT81. The memory cell 802 is configured to generate a current signal IM82 according to input data DT82. The memory cell 803 is configured to generate a current signal IM83 according to input data DT83. The memory cell 804 is configured to generate a current signal IM84 according to input data DT84. The memory cell 805 is configured to generate a current signal IM85 according to input data DT85. The memory array 800 is configured to combine the current signal IM21 and IM81-IM85 to generate the current signal IS21 at the node N22. Accordingly, the memory array 800 performs a summation corresponding to the input data DT21 and DT81-DT85 by generating the current signal IS21.

In some embodiments, one the memory cells 801-805 are controlled by corresponding two of word line signals WL81-WL810. One of the data values of the input data DT81-DT85 is associated with corresponding two of the word line signals WL81-WL810. Accordingly, one of the memory cells 801-805 is controlled according to a corresponding one of the data values of the input data DT81-DT85. Referring to FIG. 8, FIG. 2 and FIG. 3, configurations of one of the input data DT81-DT85, corresponding two of the word line signals WL81-WL810 and a corresponding one the memory cells 801-805 are similar with the configurations of the input data DT21, the word line signals WL21 and WL22 and the memory cell 210. Therefore, some descriptions are not repeated for brevity.

As illustratively shown in FIG. 8, the memory cell 801 includes a resistive element R81 and switches S81, S82. A terminal of the resistive element R81 is configured to receive the voltage signal BL21 at the node N22, and another terminal of the resistive element R81 is coupled to a node N81. A terminal of the switch S81 is coupled to the node N81, another terminal of the switch S81 is configured to receive the voltage signal SL21, and a control terminal of the switch S81 is configured to receive the word line signal WL81. A terminal of the switch S82 is coupled to the node N81, another terminal of the switch S82 is configured to receive the voltage signal SL22, and a control terminal of the switch S82 is configured to receive the word line signal WL82.

As illustratively shown in FIG. 8, the memory cell 802 includes a resistive element R82 and switches S83, S84. A terminal of the resistive element R82 is configured to receive the voltage signal BL21 at the node N22, and another terminal of the resistive element R82 is coupled to a node N82. A terminal of the switch S83 is coupled to the node N82, another terminal of the switch S83 is configured to receive the voltage signal SL21, and a control terminal of the switch S83 is configured to receive the word line signal WL83. A terminal of the switch S84 is coupled to the node N82, another terminal of the switch S84 is configured to receive the voltage signal SL22, and a control terminal of the switch S84 is configured to receive the word line signal WL84.

As illustratively shown in FIG. 8, the memory cell 803 includes a resistive element R83 and switches S85, S86. A terminal of the resistive element R83 is configured to receive the voltage signal BL21 at the node N22, and another terminal of the resistive element R83 is coupled to a node N83. A terminal of the switch S85 is coupled to the node N83, another terminal of the switch S85 is configured to receive the voltage signal SL21, and a control terminal of the switch S85 is configured to receive the word line signal WL85. A terminal of the switch S86 is coupled to the node N83, another terminal of the switch S86 is configured to receive the voltage signal SL22, and a control terminal of the switch S86 is configured to receive the word line signal WL86.

As illustratively shown in FIG. 8, the memory cell 804 includes a resistive element R84 and switches S87, S88. A terminal of the resistive element R84 is configured to receive the voltage signal BL21 at the node N22, and another terminal of the resistive element R84 is coupled to a node N84. A terminal of the switch S87 is coupled to the node N84, another terminal of the switch S87 is configured to receive the voltage signal SL21, and a control terminal of the switch S87 is configured to receive the word line signal WL87. A terminal of the switch S88 is coupled to the node N84, another terminal of the switch S88 is configured to receive the voltage signal SL22, and a control terminal of the switch S88 is configured to receive the word line signal WL88.

As illustratively shown in FIG. 8, the memory cell 805 includes a resistive element R85 and switches S89, S810. A terminal of the resistive element R85 is configured to receive the voltage signal BL21 at the node N22, and another terminal of the resistive element R85 is coupled to a node N85. A terminal of the switch S89 is coupled to the node N85, another terminal of the switch S89 is configured to receive the voltage signal SL21, and a control terminal of the switch S89 is configured to receive the word line signal WL89. A terminal of the switch S810 is coupled to the node N85, another terminal of the switch S810 is configured to receive the voltage signal SL22, and a control terminal of the switch S810 is configured to receive the word line signal WL810.

In the embodiments shown in FIG. 8, each of the switches S21, S81, S83, S85, S87 and S89 is implemented by an NMOS transistor, and each of the switches S22, S82, S84, S86, S88 and S810 is implemented by a PMOS transistor. In various embodiments, each of the switches S21, S22 and S81-S810 is implemented by one of an NMOS transistor and a PMOS transistor.

In some embodiments, the memory cell 801 is configured to perform a calculation to input data DT81 and a weight value of the resistive element R81 to generate the current signal IM81. The memory cell 802 is configured to perform a calculation to input data DT82 and a weight value of the resistive element R82 to generate the current signal IM82. The memory cell 803 is configured to perform a calculation to input data DT83 and a weight value of the resistive element R83 to generate the current signal IM83. The memory cell 804 is configured to perform a calculation to input data DT84 and a weight value of the resistive element R84 to generate the current signal IM84. The memory cell 805 is configured to perform a calculation to input data DT85 and a weight value of the resistive element R85 to generate the current signal IM85.

In some embodiments, a current value of the current signal IM81 indicates a product of a data value of the input data DT81 and the weight value of the resistive element R81. A current value of the current signal IM82 indicates a product of a data value of the input data DT82 and the weight value of the resistive element R82. A current value of the current signal IM83 indicates a product of a data value of the input data DT83 and the weight value of the resistive element R83. A current value of the current signal IM84 indicates a product of a data value of the input data DT84 and the weight value of the resistive element R84. A current value of the current signal IM85 indicates a product of a data value of the input data DT85 and the weight value of the resistive element R85. A current value of the current signal IS21 corresponds to a summation of the products of the input data DT21 and DT81-DT85 and the weight values of the resistive elements R21 and R81-R85.

In some embodiments, the resistive elements R81-R85 have resistances RV81-RV85, respectively. The weight values of the resistive elements R81-R85 is associated with the resistances RV81-RV85, respectively. For example, when one of the resistances RV81-RV85 is approximately equal to the first resistance RL1, a corresponding one of the resistive elements R81-R85 has the weight value of 1. When one of the resistances RV81-RV85 is approximately equal to the second resistance RL2, a corresponding one of the resistive elements R81-R85 has the weight value of 0.

In some embodiments, the voltage signals BL21, SL21 and SL22 approximately have the voltage levels of VR, 0 and 2×VR, respectively. In the embodiments described above, when one of the input data DT81-DT85 has the data value of +1, a corresponding one of the switches S81, S83, S85, S87 and S89 is turned on to provide the voltage signal SL21 to a corresponding one of the nodes N81-N85. Accordingly, a corresponding one of the current signals IM81-IM85 has the current value of VR divided by the corresponding one of the resistances RV81-RV85.

In the embodiments described above, when one of the input data DT81-DT85 has the data value of 0, corresponding two of the switches S81-S810 are turned off to float a corresponding one of the nodes N81-N85. Accordingly, a corresponding one of the current signals IM81-IM85 has the current value of zero.

In the embodiments described above, when one of the input data DT81-DT85 has the data value of −1, a corresponding one of the switches S82, S84, S86, S88 and S810 is turned on to provide the voltage signal SL22 to a corresponding one of the nodes N81-N85. Accordingly, a corresponding one of the current signals IM81-IM85 has the current value of −VR divided by the corresponding one of the resistances RV81-RV85. The negative sign of −VR represents that a flowing direction of the corresponding one of the current signals IM81-IM85 is from the corresponding one of the nodes N81-N85 to the node N22.

Figure 9:
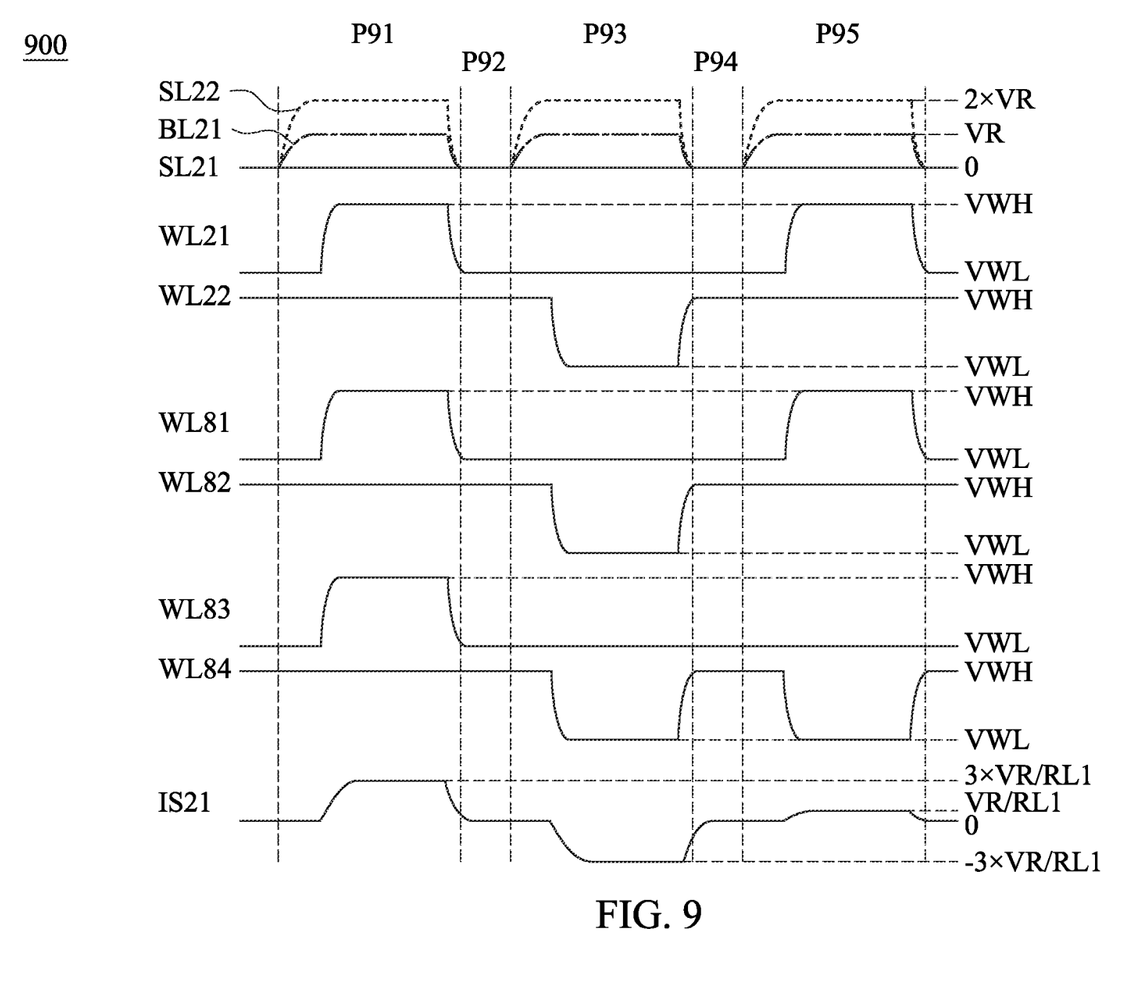
FIG. 9 is a timing diagram of the signals associated with the memory array shown in FIG. 8, in accordance with some embodiments of the present disclosure.

FIG. 9 is a timing diagram 900 of the signals associated with the memory array 800 shown in FIG. 8, in accordance with some embodiments of the present disclosure. As illustratively shown in FIG. 9, the timing diagram 900 includes periods P91-P95 arranged continuously in order.

Referring to FIG. 9 and FIG. 8, in the embodiments shown in FIG. 9, each the resistive elements R83-R85 has the second resistance RL2 corresponding to the weight value of 0. Accordingly, the products of the input data DT83-DT85 and the weight values of the resistive elements R83-R85 are zero.

On the other hand, each the resistive elements R21 and R81-R82 has the first resistance RL1 corresponding to the weight value of 1. As the second resistance being much larger than first resistance, the current signals IM83-IM85 are negligible compared to the current signals IM21 and IM81-IM82. Accordingly, the following descriptions are focus on the current signals IM21 and IM81-IM82.

Before the period P91, each of the voltage signals BL21, SL21 and SL22 has the voltage level of zero voltage. The word line signals WL21, WL22 and WL81-WL84 have the voltage levels VWL, VWH, VWL, VWH, VWL and VWH, respectively, to turn off each of the switches S21, S22 and S81-S84. In response to each of the switches S21. S22 and S81-S84 being turned off, each of the nodes N21, N81 and N82 is floated and each of the current signals IM21 and IM81-IM82 has the current level of zero ampere. Accordingly, the current signal IS21 has the current level of zero ampere.

During the period P91, the voltage signals BL21, SL21 and SL22 have the voltage levels of VR, zero and 2×VR, respectively. Each of the input data DT21, DT81 and DT82 has the data value of +1. Accordingly, each of the word line signals WL21, WL22 and WL81-WL84 has the voltage level VWH, to turn on each of the switches S21. S81 and S83 and turn off each of the switches S22, S82 and S84.

In response to the switches S21, S81 and S83 being turned on to provide the voltage signal SL21 to the nodes N21, N81 and N82, each of the current signals IM21 and IM81-IM82 has the current level of VR/RL1. The memory array 800 combines the current signals IM21 and IM81-IM82 as the current signal IS21 which has the current level of 3×VR/RL1. The current level of 3×VR/RL1 corresponds to a summation of the product of input data DT21 having the data value of +1 and the resistive element R21 having the weight value of 1, the product of input data DT81 having the data value of +1 and the resistive element R81 having the weight value of 1 and the product of input data DT82 having the data value of +1 and the resistive element R82 having the weight value of 1.

During the period P92, each of the voltage signals BL21, SL21 and SL22 has the voltage level of zero voltage. The word line signals WL21, WL22 and WL81-WL84 have the voltage levels VWL, VWH, VWL, VWH, VWL and VWH, respectively, to turn off each of the switches S21, S22 and S81-S84. In response to each of the switches S21, S22 and S81-S84 being turned off, each of the nodes N21, N81 and N82 is floated and each of the current signals IM21 and IM81-IM82 has the current level of zero ampere. Accordingly, the current signal IS21 has the current level of zero ampere.

During the period P93, the voltage signals BL21, SL21, SL22 have the voltage levels of VR, zero and 2×VR, respectively. Each of the input data DT21, DT81 and DT82 has the data value of −1. Accordingly, each of the word line signals WL21, WL22 and WL81-WL84 has the voltage level VWL, to turn off each of the switches S21, S81 and S83 and turn on each of the switches S22, S82 and S84.

In response to the switches S22, S82 and S84 being turned on to provide the voltage signal SL22 to the nodes N21, N81 and N82, each of the current signals IM21 and IM81-IM82 has the current level of −VR/RL1. The memory array 800 combines the current signals IM21 and IM81-IM82 as the current signal IS21 which has the current level of −3×VR/RL1. The current level of −3×VR/RL1 corresponds to a summation of the product of input data DT21 having the data value of −1 and the resistive element R21 having the weight value of 1, the product of input data DT81 having the data value of −1 and the resistive element R81 having the weight value of 1 and the product of input data DT82 having the data value of −1 and the resistive element R82 having the weight value of 1.

During the period P94, each of the voltage signals BL21, SL21 and SL22 has the voltage level of zero voltage. The word line signals WL21, WL22 and WL81-WL84 have the voltage levels VWL, VWH, VWL, VWH, VWL and VWH, respectively, to turn off each of the switches S21, S22 and S81-S84. In response to each of the switches S21, S22 and S81-S84 being turned off, each of the nodes N21, N81 and N82 is floated and each of the current signals IM21 and IM81-IM82 has the current level of zero ampere. Accordingly, the current signal IS21 has the current level of zero ampere.

During the period P95, the voltage signals BL21, SL21 and SL22 have the voltage levels of VR, zero and 2×VR, respectively. The input data DT21, DT81 and DT82 have the data value of +1, +1 and −1, respectively. Accordingly, the word line signals WL21, WL22 and WL81-WL84 have the voltage levels VWH, VWH, VWH, VWH, VWL and VWL, respectively, to turn on each of the switches S21, S81 and S84 and turn off each of the switches S22, S82 and S83.

In response to the switches S21 and S81 being turned on to provide the voltage signal SL21 to the nodes N21 and N81, each of the current signals IM21 and IM81 has the current level of VR/RL1. In response to the switch S84 being turned on to provide the voltage signal SL22 to the nod N82, the current signal IM82 has the current level of −VR/RL1. The memory array 800 combines the current signals IM21 and IM81-IM82 as the current signal IS21 which has the current level of VR/RL1. The current level of VR/RL1 corresponds to a summation of the product of input data DT21 having the data value of +1 and the resistive element R21 having the weight value of 1, the product of input data DT81 having the data value of +1 and the resistive element R81 having the weight value of 1 and the product of input data DT82 having the data value of −1 and the resistive element R82 having the weight value of 1. It is noted that the current signal IM82 cancels one of the current signals IM21 and IM81 at the node N22, to accomplish the summation.

In various embodiments, in response to various data values and weight values, the memory array 800 outputs the current signal IS21 having various current values. Accordingly, the memory array 800 performs a summation of the products between the data values and weight values by generating the current signal IS21.

Also disclosed is a semiconductor device. The semiconductor device includes a memory array. The memory array is configured to calculate first data and second data. The memory array includes a first memory cell and a second memory cell. The first memory cell is configured to generate a first current signal at a first node, in response to the first data. The second memory cell is configured to generate a second current signal at the first node when the first memory cell generating the first current signal, in response to the second data. When the first data has a first data value and the second data has a second data value, the second memory cell is further configured cancel the first current signal with the second current signal. The second data value is a negative value of the first data value.

Also disclosed is a method. The method includes: generating a first current signal and a second current signal simultaneously; combining the first current signal and the second current signal, to generate a third current signal indicating a summation of first data and second data; in response to the first data having a first data value, increasing a current level of the third current signal by the first current signal; and in response to the second data having a second data value, decreasing the current level of the third current signal by the second current signal. The second data value is a negative value of the first data value.

Also disclosed is a semiconductor device. The semiconductor device includes a first memory cell. The first memory cell is configured to generate a first current signal indicating a first product of first data and a first weight value. The first memory cell includes a first resistive element, a first switch and a second switch. The first resistive element is configured to store the first weight value. The first switch is coupled to the first resistive element at a first node, configured to be turned on in response to the first data having a first data value, configured to be turned off in response to the first data having a second data value, and configured to be turned off in response to the first data having a third data value. The second switch is coupled to the first node, configured to be turned on in response to the first data having the third data value, configured to be turned off in response to the first data having the second data value, and configured to be turned off in response to the first data having the first data value. The first data value, the second data value and the third data value are different from each other. The first current signal flows through the first resistive element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising a memory array configured to calculate first data and second data, the memory array comprising:
   a first memory cell configured to generate a first current signal at a first node, in response to the first data; and
   a second memory cell configured to generate a second current signal at the first node when the first memory cell generating the first current signal, in response to the second data,
   wherein when the first data has a first data value and the second data has a second data value, the second memory cell is further configured cancel the first current signal with the second current signal,
the second data value is a negative value of the first data value.

2. The semiconductor device of claim 1, wherein the first memory cell comprises:
a first switch configured to adjust a second node to a first voltage level when the first data has the first data value;
a second switch configured to adjust the second node to a second voltage level when the first data has the second data value; and
a first resistive element coupled between the first node and the second node,
wherein a third voltage level of the first node is between the first voltage level and the second voltage level.

3. The semiconductor device of claim 2, wherein
when the first data has the first data value, the first switch is turned on and the second switch is turned off,
when the first data has the second data value, the first switch is turned off and the second switch is turned on, and
when the first data has a third data value between the first data value and the second data value, each of the first switch and the second switch is turned off.

4. The semiconductor device of claim 2, wherein the second memory cell comprises:
a third switch configured to adjust a third node to the first voltage level when the second data has the first data value;
a fourth switch configured to adjust the third node to the second voltage level when the second data has the second data value; and
a second resistive element coupled between the first node and the third node.

5. The semiconductor device of claim 2, wherein the first memory cell further comprises:
a third switch configured to adjust the second node to a third voltage level when the first data has a third data value; and
a fourth switch configured to adjust the second node to a fourth voltage level when the first data has a fourth data value,
wherein each of the first data value and the second data value is between the third data value and the fourth data value, and
each of the first voltage level and the second voltage level is between the third voltage level and the fourth voltage level.

6. The semiconductor device of claim 1, wherein in response to the first data having the first data value and the second data having the second data value, the first current signal flows from the first node to the first memory cell and the second current signal flows from the second memory cell to the first node.

7. The semiconductor device of claim 1, wherein the memory array is further configured to combine the first current signal and the second current signal to generate a third current signal at the first node,
when the first data has the first data value, the first memory cell is configured to increase a current level of the third current signal by the first current signal,
when the first data has the second data value, the first memory cell is configured to decrease the current level of the third current signal by the first current signal,
when the second data has the first data value, the second memory cell is configured to increase the current level of the third current signal by the second current signal, and
when the second data has the second data value, the second memory cell is configured to decrease the current level of the third current signal by the second current signal.

8. A method, comprising:
generating a first current signal and a second current signal simultaneously;
combining the first current signal and the second current signal, to generate a third current signal indicating a summation of first data and second data;
in response to the first data having a first data value, increasing a current level of the third current signal by the first current signal; and
in response to the second data having a second data value, decreasing the current level of the third current signal by the second current signal,
wherein the second data value is a negative value of the first data value.

9. The method of claim 8, further comprising:
in response to the first data having the second data value, decreasing the current level of the third current signal by the first current signal; and
in response to the second data having the first data value, increasing the current level of the third current signal by the second current signal.

10. The method of claim 8, further comprising:
in response to the first data having the first data value, providing a first voltage signal having a first voltage level to a first node;
in response to the first data having the second data value, providing a second voltage signal having a second voltage level to the first node; and
generating the third current signal at a second node having a third voltage level,
wherein the first current signal flows through each of the first node and the second node, and
the third voltage level is between the first voltage level and the second voltage level.

11. The method of claim 10, further comprising:
transforming the first data into a first word line signal and a second word line signal;
controlling a first switch and a second switch by the first word line signal and the second word line signal, respectively;
receiving the first voltage signal by a first terminal of the first switch; and
receiving the second voltage signal by a first terminal of the second switch,
wherein a second terminal of the first switch is coupled to the first node, and
a second terminal of the second switch is coupled to the first node.

12. The method of claim 10, further comprising:
in response to the second data having the first data value, providing the first voltage signal to a third node; and
in response to the second data having the second data value, providing the second voltage signal to the third node,
wherein the second current signal flows through each of the first node and the third node.

13. The method of claim 8, further comprising:
generating a third current signal, the first current signal and the second current signal simultaneously;

combining the third current signal, the first current signal and the second current signal, to generate the third current signal indicating the summation of third data, the first data and the second data;

in response to the third data having the first data value, increasing the current level of the third current signal by the third current signal; and in response to the third data having the second data value, decreasing the current level of the third current signal by the third current signal.

14. The method of claim 13, further comprising:

in response to each of the first data, the second data and the third data having the first data value, adjusting the third current signal to a first voltage level;

in response to each of the first data, the second data and the third data having the second data value, adjusting the third current signal to a second voltage level; and in response to one of the first data, the second data and the third data having the first data value and another one of the first data, the second data and the third data having the second data value, adjusting the third current signal to a third voltage level between the first voltage level and the second voltage level.

15. A semiconductor device, comprising a first memory cell configured to generate a first current signal indicating a first product of first data and a first weight value, the first memory cell comprising:

a first resistive element configured to store the first weight value;

a first switch coupled to the first resistive element at a first node, configured to be turned on in response to the first data having a first data value, configured to be turned off in response to the first data having a second data value, and configured to be turned off in response to the first data having a third data value; and a second switch coupled to the first node, configured to be turned on in response to the first data having the third data value, configured to be turned off in response to the first data having the second data value, and configured to be turned off in response to the first data having the first data value, wherein the first data value, the second data value and the third data value are different from each other, and the first current signal flows through the first resistive element.

16. The semiconductor device of claim 15, wherein the first switch is further configured to receive a first voltage signal having a first voltage level, the second switch is further configured to receive a second voltage signal having a second voltage level, the first resistive element is coupled between the first node and a second node having a third voltage level, the third voltage level is between the first voltage level and the second voltage level, and a voltage difference between the third voltage level and the first voltage level is approximately equal to a voltage difference between the third voltage level and the second voltage level.

17. The semiconductor device of claim 16, further comprising a second memory cell configured to generate a second current signal indicating a second product of second data and a second weight value, the second memory cell comprising:

a second resistive element configured to store the second weight value;

a third switch coupled to the second resistive element at a third node, configured to be turned on in response to the second data having the first data value, configured to be turned off in response to the second data having the second data value, and configured to be turned off in response to the second data having the third data value; and a fourth switch coupled to the third node, configured to be turned on in response to the second data having the third data value, configured to be turned off in response to the second data having the second data value, and configured to be turned off in response to the second data having the first data value, wherein the second current signal flows through the second resistive element.

18. The semiconductor device of claim 17, wherein the first memory cell and the second memory cell are configured to combine the first current signal and the second current signal at the second node to generate a third current signal indicating a summation of at least the first product and the second product, the third current signal has a first current level when each of the first data and the second data has the first data value, the third current signal has a second current level when each of the first data and the second data has the second data value, the third current signal has a third current level when one of the first data and the second data has the first data value and another one of the first data and the second data has the second data value, and the third current level is larger than one of the first current level and the second current level, and is smaller than another one of the first current level and the second current level.

19. The semiconductor device of claim 17, wherein the third switch is further configured to receive the first voltage signal, the fourth switch is further configured to receive the second voltage signal, and the second resistive element is coupled between the third node and the second node.

20. The semiconductor device of claim 16, wherein the first memory cell further comprises:

a third switch coupled to the first node, configured to be turned on in response to the first data having a fourth data value, to provide a third voltage signal having a fourth voltage level to the first node, wherein the first data value, the second data value, the third data value and the fourth data value are different from each other, and the first voltage level, the second voltage level, the third voltage level and the fourth voltage level are different from each other.

* * * * *